United States Patent [19]

Joy et al.

[11] Patent Number: 4,697,332

[45] Date of Patent: Oct. 6, 1987

[54] METHOD OF MAKING TRI-WELL CMOS BY SELF-ALIGNED PROCESS

[75] Inventors: Richard C. Joy, Los Gatos; Tarsaim L. Batra, Cupertino, both of Calif.

[73] Assignee: Gould Inc., Rolling Meadows, Ill.

[21] Appl. No.: 779,388

[22] Filed: Sep. 20, 1985

Related U.S. Application Data

[63] Continuation-in-part of Ser. No. 614,418, May 25, 1984, abandoned.

[51] Int. Cl.$^4$ ............... H01L 21/22; H01L 7/54; H01L 21/263
[52] U.S. Cl. ............... 437/29; 148/DIG. 82; 357/42; 357/91; 437/41; 437/57
[58] Field of Search ............... 29/571, 576 B, 578; 148/1.5, 187; 357/42, 91

[56] References Cited

U.S. PATENT DOCUMENTS

| 4,554,726 | 11/1985 | Hillenius et al. | 29/571 |
| 4,584,027 | 4/1986 | Metz et al. | 148/1.5 |
| 4,601,098 | 7/1986 | Oda | 29/578 |

FOREIGN PATENT DOCUMENTS 0091256 10/1983 European Pat. Off. .

OTHER PUBLICATIONS

IBM Tech. Disc. Bull., 27 (Apr. 1985), 6806.
IBM, TDB, 27 (Apr. 1985), 6717.

*Primary Examiner*—Upendra Roy

[57] ABSTRACT

A semiconductor structure having at least three types of wells which may be of different doping levels and methods of manufacturing such a structure, are disclosed. In one method, regions which will become active devices are protected with a nitride layer as the associated well-regions are implanted. In another method, previously implanted wells are covered with thick oxide which in combination with the nitride layer provides automatic alignment of adjacent wells. In yet another method, implanted wells are covered with oxide while a last well is implanted with this last well being defined by both thick oxide and photoresist. All methods avoid a masking step and avoid the need for aligning the edge of a later photoresist mask with the edge of an earlier photoresist mask. The structures formed by these methods may have heavily-doped P wells, heavily-doped N wells, and lightly-doped P or N wells, or both, for forming higher breakdown voltage devices on the same chip with lower breakdown voltage devices.

15 Claims, 33 Drawing Figures

METHOD OF MAKING TRI-WELL CMOS BY SELF-ALIGNED PROCESS

This is a continuation-in-part of application Ser. No. 614,418, filed by the same inventors on May 25, 1984 now abandoned.

BACKGROUND OF THE INVENTION

This invention relates to a tri-well CMOS structure and method of manufacture which provides at least three kinds of active regions for device formation. The active regions may include lightly doped regions of either N or P type for the formation of devices having a high breakdown voltage, moderately to heavily doped P wells for N channel devices having a low breakdown voltage, and moderately to heavily doped N well regions for P channel devices having a low breakdown voltage.

Figure 1A:
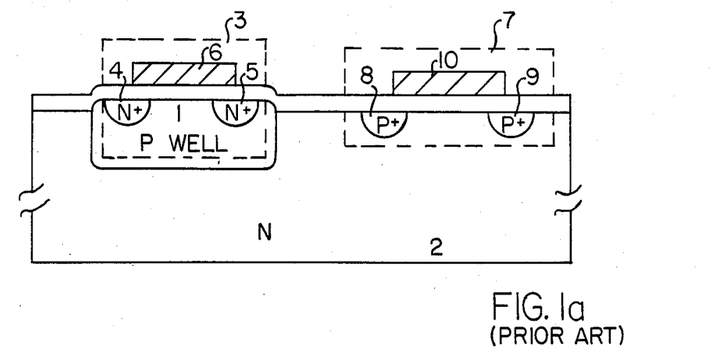
FIG. 1a shows a prior art P well CMOS structure.

A prior art P well CMOS structure is illustrated in FIG. 1a. P well 1 is diffused into a silicon substrate 2. Silicon substrate 2 has been moderately doped with N type dopants to a level within the range of approximately $2 \times 10^{15}$ to $4 \times 10^{15}$ atoms/cm$^3$. Source and drain regions 4 and 5 respectively of an N channel device 3 having a gate 6 are then formed in P well 1, and source and drain regions 8 and 9 of a P channel device 7 having a gate 10 are formed in N type substrate 2.

In practice, due to processing variations, there is some deviation between the actual doping levels achieved in the P well and the N substrate and their desired doping levels. For control purposes, in order to render these deviations less significant, the doping of P well 1 is at least an order of magnitude greater than the doping of N substrate 2, thereby insuring that, regardless of processing variations, P well 1 will have a sufficiently high concentration of P type dopants.

Problems of scale emerged from the prior art structure as the device density i.e., the number of devices per unit area, was increased. For example, as the distance between the P+ source and drain regions 8 and 9 of device 7 is reduced, the doping of N substrate 2 must increase to obtain appropriate electrical parameters, such as device threshold voltage, in the shorter channel length P channel transistor 7. However, increasing the doping of N substrate 2 requires a corresponding proportional increase in the doping level of P well 1 for control purposes as explained above.

The increase in the doping level of P well 1 causes increased junction capacitance between N+ source and drain regions 4 and 5 and P well 1. In fact, for a single-sided junction under zero bias, the junction capacitance varies directly as the square root of the dopant concentration on the lightly doped side of the junction, as shown in MOS INTEGRATED CIRCUITS, pgs. 45 and 46, Engineering Staff of American Micro-Systems, Robert E. Krieger Pub. Co., Malibu, Fla. (1979), which is incorporated herein by reference. In turn this increased capacitance has the undesirable effect of reducing the switching speed of transistor 3.

Figure 1B:
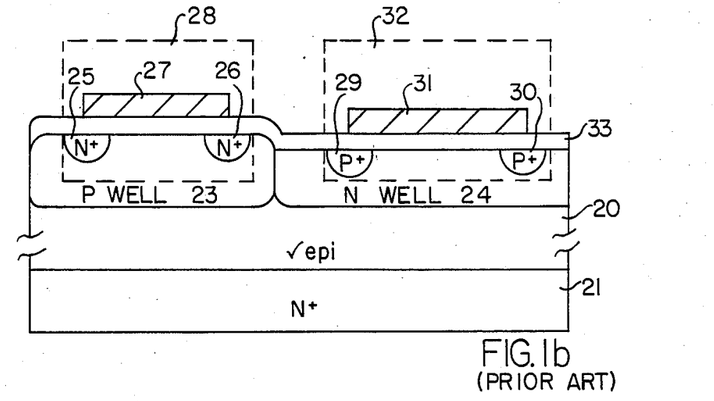
FIG. 1b shows a prior art twin-tub CMOS structure.

In order to overcome these problems of scale, a twin-tub CMOS technology was developed by Parrillo, et al., in "TWIN-TUB CMOS-A TECHNOLOGY FOR VLSI CIRCUITS", IEEE Tech Dig., Int. Electron Device Meet., 1980, p. 752–755 which is incorporated herein by reference. FIG. 1b illustrates the Parillo Twin-tub structure.

The Parillo structure includes lightly doped epitaxial region 20 formed on an N+ substrate 21. The use of an N+ substrate reduces the substrate resistance and prevents "latch-up", a term which refers to the turning on of "parasitic" bipolar transistors within the structure shown in FIG. 1b as will be explained later.

Both a P well 23 and an N well 24 are then formed in the epitaxial layer 20 by ion implantation. This is accomplished in a self-aligned manner by first defining an oxide-nitride mask (not shown), implanting and selectively oxidizing N well 24, removing the remaining mask and implanting P well 23 self-aligned to the oxide masked N well 24.

The P well 23 and N well 24 are doped independently in order to optimize the performance characteristics of the active devices formed in P well 23 and N well 24, respectively. For example, the active devices may include transistor 28 having gate 27, gate dielectric layer 33 and source and drain regions 25 and 26, respectively, formed in P well 23 and transistor 32 having gate 31, gate dielectric layer 33, and source and drain regions 29 and 30 formed in N well 24. Thus it can be seen that increasing the doping of N well 24 to accommodate a decrease in the dimensional parameters of the P channel device 32 no longer necessitates a corresponding increase in the dopant concentration of P well 23. Of importance, parasitic bipolar transistors exist within this twin well structure. For example, an NPN parasitic transistor is formed by N+ region 26, P well 23, and N+ substrate 21. However, the N+ substrate has low resistivity and thus prevents "latch-up". Latch-up is a well-known problem, an analysis of which is presented in an article entitled "Elimination of Latch-up in Bulk CMOS", IEDM Paper 10.2, Dec. 8–10, Washington, D.C., which is incorporated herein by reference.

Both N well 24 and P well 23 in the prior art twin-tub structure described by Parillo are heavily doped. Parillo uses a dopant concentration of about $10^{16}$ atoms/cm$^3$ at the surface of each well. Because of the relatively high doping in both wells, this structure is not well suited to integration with devices such as transistors, diodes, or resistors which are designed to operate at high voltages, say greater than 20 volts. In particular the prior art twin-tub structure is not suited for the integration of erasable programmable read only memories (EPROMS) or with electrically erasable programmable read only memories (EEPROMS) which require junction breakdown voltages greater than approximately 20 volts.

In addition to the need for providing both high and low voltage devices on the same chip, and thus providing a variety of doping levels for different wells, it is desirable to develop methods for forming structures which are faster and less expensive, and allow for forming smaller devices while retaining high yield. Various prior art methods have been developed to accomplish the objective of providing on the same chip different doping levels and dopants for different wells.

Figure 2A:
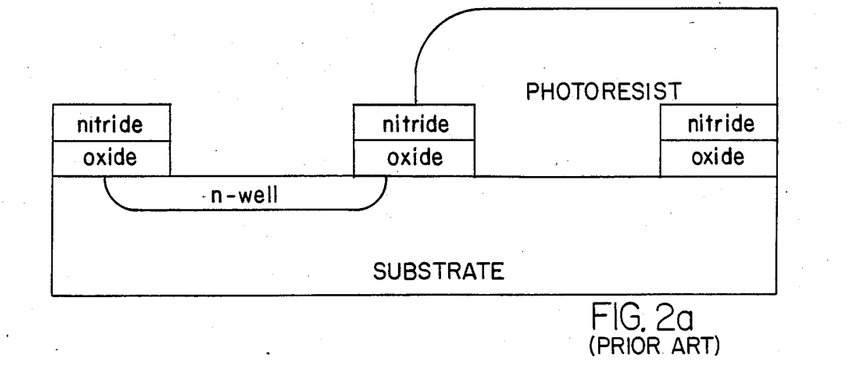
FIGS. 2a and 2b show a prior art method of forming windows for the subsequent formation of doped wells followed in series by separate masking of subsequent wells.
Figure 2B:
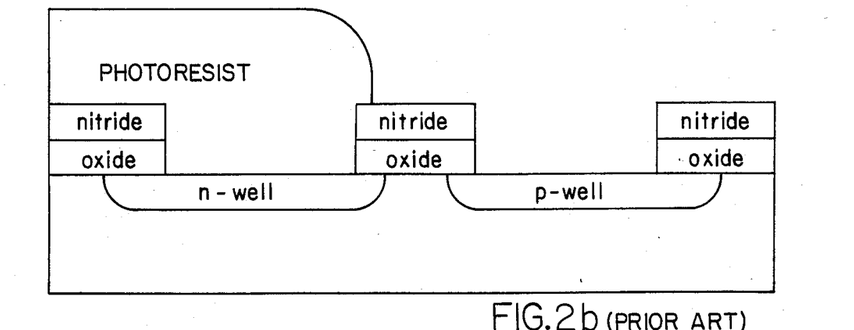

A method shown in FIGS. 2a and 2b forms multiple windows in a nitride/oxide layer, exposing the surface to permit the subsequent formation of diffusion isolation regions, base regions, and collector contact regions in the semiconductor body. The areas are masked, exposed, and doped in a predetermined sequence. The original areas of oxide/nitride, which were left between windows serve to define the edges of the wells, and on these areas of oxide/nitride the edges of successive photoresist masks are defined. Mask misalignment tolerances can be less stringent because the edges of the masks are formed over the previously formed areas of nitride/oxide and the nitride/oxide serves to define the edge of the well. U.S. Pat. No. 3,928,081 to Marley, Jr., et al., shows such a method for eliminating mask misalignment tolerances.

Figure 3A:
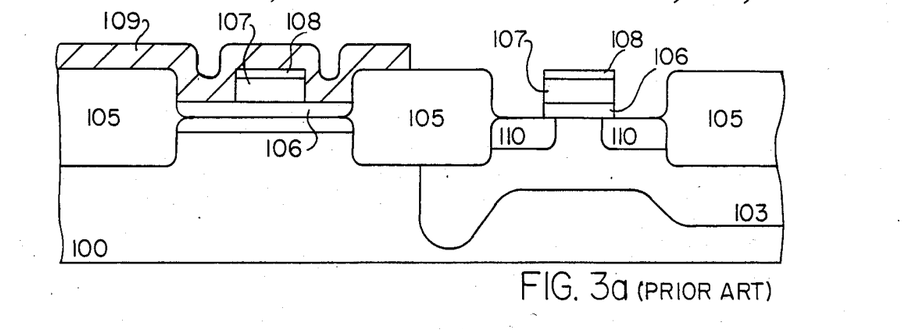
FIGS. 3a and 3b show a prior art method of using an oxide region to define the edge of a well to be doped followed by growing an oxide or nitride mask over the doped region before removing the photoresist mask.
Figure 3B:
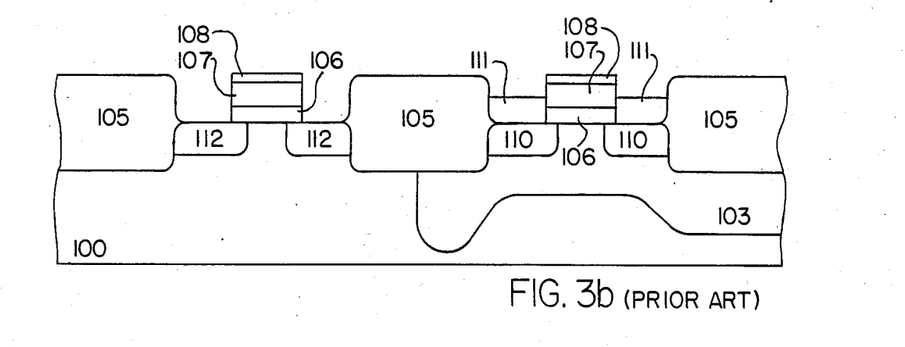

As shown in FIGS. 3a and 3b, U.S. Pat. No. 4,450,021, issued to Batra, et al., one of the coinventors of this application, uses a mask 109 for defining regions 110 to be doped and uses the same mask for depositing a protective layer 111 over the doped regions. With this arrangement, the alignment of the edge of the protective layer 111 is assured, because the edge of the oxide defines the area to be doped. When the mask is removed, the second regions 112 which are now exposed are automatically aligned to be doped without interfering with the first regions which are covered by protective layer 111. By this method it is possible to achieve doping of two wells with one masking step, thus saving the time of applying and defining the mask and thus also achieving automatic self-alignment of the areas to be doped. The method shown in this prior art patent is described as being applicable to implanting source and drain regions in the chip.

Thus, use of portions of the device as a mask for forming later portions is a well-known method of preventing misalignment.

Figure 4A:
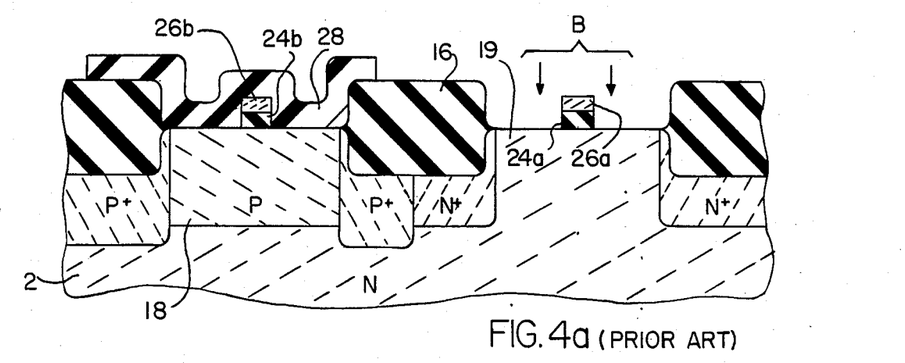
FIGS. 4a and 4b show a prior art method of growing adjacent wells using a mask of heavily-doped oxide which implants dopants of one conductivity type while dopants of opposite conductivity type are implanted into an exposed adjacent area.
Figure 4B:
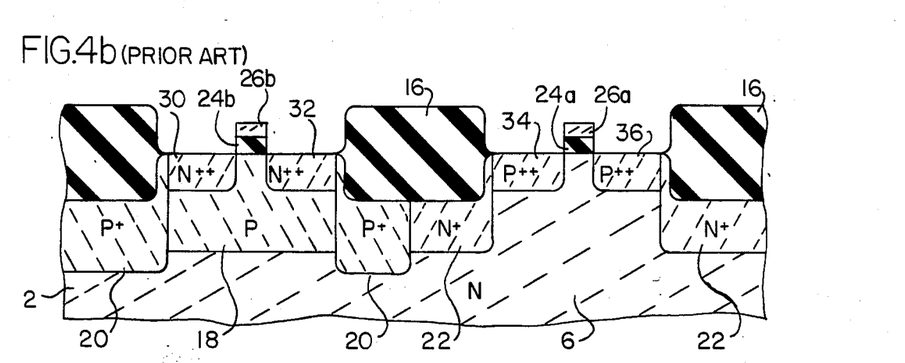

Cerofolini, et al., in U.S. Pat. No. 4,277,291, discloses a different method, shown in FIGS. 4a and 4b, which could be used for forming adjacent, self-aligned N and P wells in which a heavily N-doped oxide mask is in place during P-doping and diffusion. The N-doped oxide mask prevents doping of the masked portion during the P-doping step and then produces diffusion of the N-dopant from the doped oxide into the substrate at the same time the P-doped region is being diffused into the substrate, resulting in simultaneous formation of self-aligned N and P wells.

SUMMARY

The present invention provides a semiconductor structure having at least three active regions for device formation formed in a lightly doped substrate, for example, a first moderately to heavily doped well of the same conductivity type as the substrate, a second moderately to heavily doped well having conductivity type opposite to that of the substrate, and a third lightly doped region of either type having a conductivity of the same order of magnitude as the substrate. In one embodiment of the structure the third region is a portion of the substrate itself.

The present invention also provides a method of forming a semiconductor structure which requires fewer masking steps than the number of wells to be formed in the substrate. Two embodiments of this method are described, each achieving a tri-well substrate using only two photomasking steps. Both methods are appropriate for applications in which the multiple devices on a chip will be separated by a thick field oxide. With the first method adjacent wells are not self-aligned. The first method involves placing an oxide/nitride layer over regions which will become active devices and doping through the nitride the substrate of the active device and the adjacent exposed field. The second method involves first defining an exposed region to be doped, then doping that region to form a well in which the field and active region of a device will be formed, then covering that region with a thick oxide layer. Using a second photoresist mask, another area of thin oxide/nitride is removed, with the newly formed thick oxide and or the oxide/nitride serving to define edges of the second exposed area, and so on with subsequent regions. This order of formation causes subsequent well regions to be automatically self-aligned with previous well regions and also results in a process for forming successive well regions requiring fewer masking steps than the number of wells, in contrast to previous methods. This improvement in turn results in allowing a higher yield of smaller devices at a lower manufacturing cost. Neither method requires accurate alignment of a photoresist mask with a previous photoresist mask. Alternative embodiments are also described.

DETAILED DESCRIPTION

Figure 5:
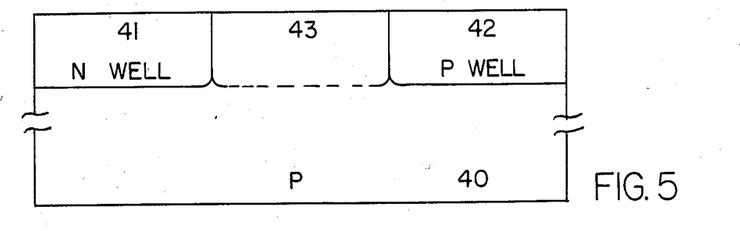
FIG. 5 shows one embodiment of the tri-well CMOS structure constucted in accordance with this invention.

One embodiment of a structure constructed in accordance with this invention is depicted in cross sectional view in FIG. 5. The region 40 is a lightly doped P type semiconductor substrate, typically silicon. Alternatively, region 40 is epitaxial semiconductor material formed on an underlying substrate. For simplicity, this specification will refer to region 40 as a substrate.

In this embodiment, substrate 40 is a P type silicon semiconductor having a resistivity in the range of approximately 30 to 100 ohm-cm. For a P type silicon substrate, a resistivity of approximately 30 to 100 ohm-cm corresponds to an impurity concentration of approximately $1 \times 10^{14}$ to $2.5 \times 10^{14}$ P type atoms/cm$^3$ in the substrate. This is shown in Grove, *Physics and Technology of Semiconductor Devices*, pgs. 111–113, John Wiley & Sons (1967) which is incorporated herein by reference. In general, the resistivity of the substrate decreases as the impurity concentration in the substrate increases.

Since resistivity, $\rho$, is the reciprocal of conductivity, $\sigma$, (i.e., $\sigma = 1/\rho$), one may equivalently specify the corresponding conductivity of the substrate.

In turn the breakdown voltage for several important classes of PN junctions is inversely proportional to the substrate impurity concentration. For example, a so-called one-sided step junction, which is an abrupt junction wherein the impurity concentration in each of the P and N regions is uniform throughout that region and wherein the concentration of the impurity on one side of the junction is much larger than on the other side of the junction, has the property that the junction breakdown voltage is inversely proportional to the substrate dopant concentration for a constant critical field as shown in Grove, supra, at pg. 194, which is incorporated herein by reference. Similarly, very shallow diffused junctions behave very much like one-sided step junctions. See Grove, supra, at pg. 159.

Thus low P type impurity concentrations in the substrate 40 and region 43, typically of the order of $1 \times 10^{14}$ to $2.5 \times 10^{14}$ atoms/cm$^3$, permit the formation of active devices in region 43 having high junction breakdown voltages (greater than 20 volts). In another embodiment, region 43 is simply a portion of the substrate 40.

N well 41 is an N type region formed in substrate 40, typically by ion implantation, having moderate to heavy dopant levels of an N type material, for example, within the range of approximately $8 \times 10^{14}$ to $3 \times 10^{16}$ atoms/cm$^3$. Alternatively, well known diffusion processes can be used to form N well 41. The N well 41 is suitable for the formation of low voltage devices, for example P channel transistors, resistors or diodes (not shown).

P well 42 is a region of moderate to heavily doped P type semiconductive material formed (typically by ion implantation or diffusion) in the substrate 40. The P type dopant concentration in P well 42 ranges from approximately $8 \times 10^{14}$ to $3 \times 10^{16}$ atoms/cm$^3$. P well 42 is suitable for the formation of low voltage devices, for example resistors, diodes, or N channel transistors.

P well 42 and N well 41 of FIG. 5 are doped independently to achieve desired electrical characteristics, e.g. threshold voltages, which depend on dopant levels, of the P channel and N channel devices formed therein. Region 43 is a lightly-doped region of P type semiconductive material. Typically the dopant level in region 43 is within the range of approximately $1 \times 10^{14}$ to $4 \times 10^{14}$ or more P type atoms/cm$^3$ and is thus suitable for the formation of devices having high junction breakdown voltages (greater than 20 volts) in close proximity to the low voltage devices formed in P well 42 and N well 41.

The above embodiment uses a P type substrate. An N type substrate can also be used, where well region 43 is of P type conductivity. However when an N type substrate is used, it should be noted that generally lower impurity concentrations produce the same resistivity, as shown in Grove, supra, at page 113. For example, a substrate resistivity of 10 to 50 ohm-cm corresponds to an N type impurity concentration of approximately $4 \times 10^{14}$ to $1 \times 10^{14}$ atoms/cm$^3$.

It is also important to note that the arrangement of the regions 41, 42, and 43 shown in FIG. 5 is not critical.

Figure 6:
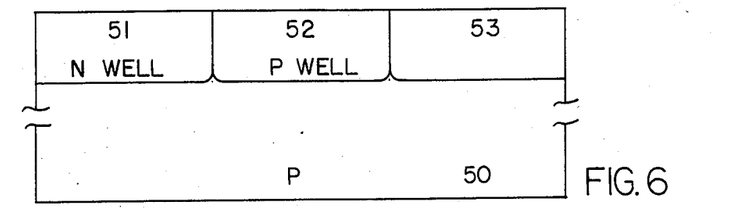
FIG. 6 shows a second embodiment of the tri-well CMOS structure constructed in accordance with this invention.

For example in another embodiment, as shown in FIG. 6, N well 51 and region 53 are separated by P well 52. In this embodiment, region 53 has the same conductivity type as the substrate 50 and a conductivity of the same order of magnitude as substrate 50.

One process for forming a tri-well CMOS structure according to the present invention is illustrated in FIGS. 7a through 7j. Another begins with FIG. 7a and moves to FIGS. 8a-8h. In either case, the process begins with a lightly doped substrate 60 of either N type or P type. When substrate 60 is P type, a dopant concentration of approximately $1 \times 10^{14}$ atoms/cm$^3$ is typical. An N type substrate would have a lower dopant concentration.

Figure 7A:
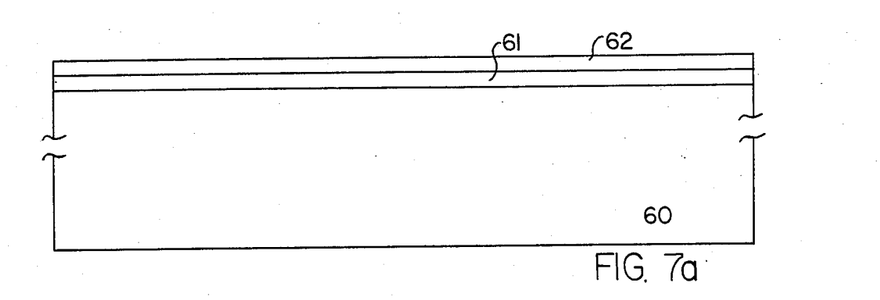
FIGS. 7a through 7j show steps in forming three wells of different compositions using the method of this invention in an embodiment where active devices will be formed after formation of the wells, and where adjacent wells are not self-aligned.

FIG. 7a shows a lightly doped semiconductor structure with a base oxide layer and a nitride layer formed thereon. Base oxide layer 61 is formed on substrate 60 to a thickness within the range of approximately 500 to 1000 Å, for example by thermal oxidation at approximately 1000° C. for approximately 45 to 75 minutes in an atmosphere of $O_2 + 3\%$ HCl.

Nitride layer 62 is formed on base oxide layer 61 using, for example, low pressure chemical vapor deposition (LPCVD) to a thickness of approximately 1500 Å. Oxide 61 separates nitride 62 from substrate 60 and thus allows nitride 61 to be completely removed at a later stage.

First Embodiment

Figure 7B:
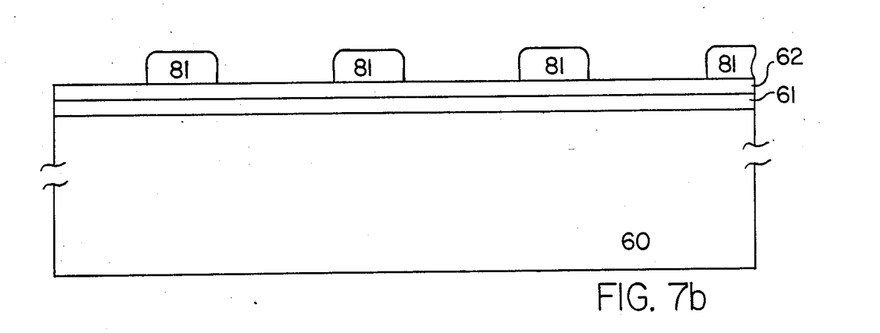
Figure 7C:
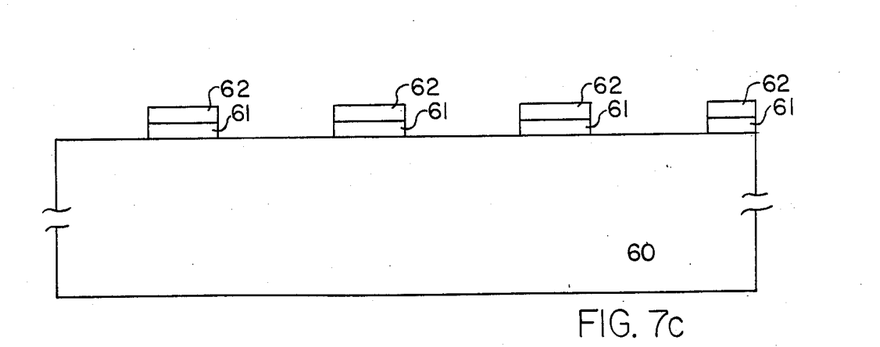

According to one method for forming the separately implanted well regions of this invention, base oxide 61 and nitride layer 62 shown in FIG. 7a are then patterned to define the active regions of the device shown in FIG. 7b. The active regions remain covered by oxide 61 and nitride 62 while the adjacent field regions are exposed. This patterning is accomplished by spinning photoresist 81 onto nitride 62 which is then soft baked. The field mask is then aligned to the wafer flat and the portions of photoresist exposed by the mask are subjected to actinic radiation. Exposed portions of photoresist 81 are then removed by development. Photoresist 81 is then hard baked so that it is not affected by the etchants used to remove the unmasked regions of nitride and oxide. Typically, plasma etching is used to remove the unmasked regions of nitride and buffered HF is used to remove the regions of oxide. The remaining portions of photoresist 81 are removed after the etching step in order to produce structure 64 shown in FIG. 7c. As will be appreciated by those of ordinary skill in the art, if desired, the photoresist 81 and masking to define active areas (i.e., those areas located in substrate 60 beneath portions of oxide 61 and nitride 62 which remain in the structure of FIG. 7c) can be postponed until after formation of all desired well regions.

Figure 7D:
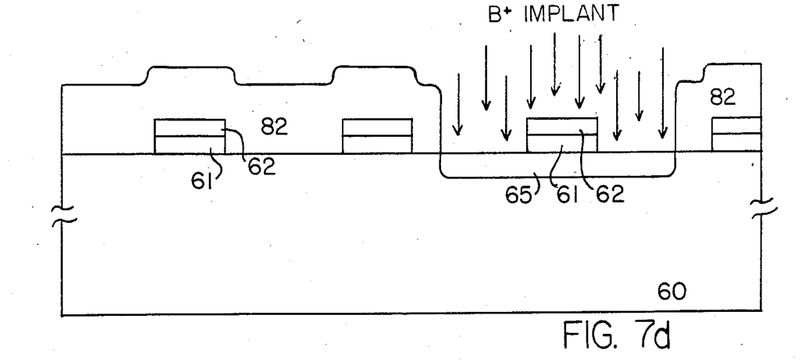

A P well mask of photoresist 82 is formed on structure 64 which exposes the P well (N channel) field and active regions 65. At this stage, the field regions are fully exposed and the active regions are partly protected by the nitride/oxide sandwich 61, 62 as shown in FIG. 7d.

A field implant of P type dopants is then accomplished using boron at a dosage of approximately $3 \times 10^{13}$ ions/cm$^2$ and an energy level of approximately 25 KeV. This step implants a shallow boron charge into the field regions which raises the field inversion potential, hence preventing parasitic field devices.

Next, a P-well implant is performed using Boron at a dosage of approximately $6 \times 10^{12}$ ions/cm$^2$ at an energy level of approximately 120 KeV, which is sufficient that the P well is implanted through the nitride/oxide layer.

Figure 7E:
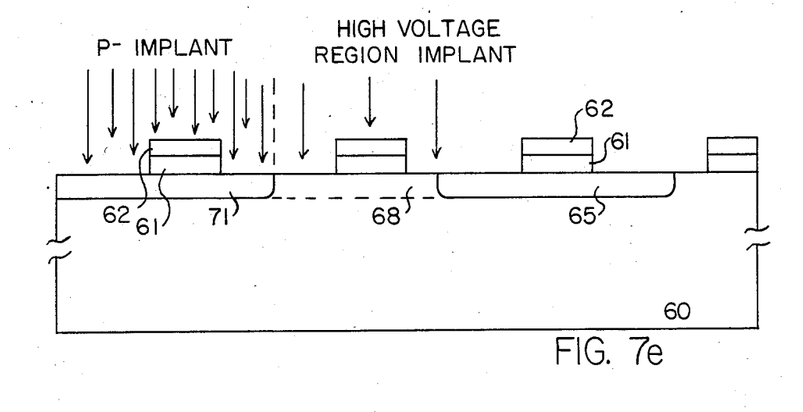

As shown in FIG. 7e, similarly, an N well mask of photoresist is used to expose N well (P channel) field and active regions 71. A field implant of N type dopants is then accomplished using phosphorus. The N well implant is performed using phosphorous at a dosage of approximately $2 \times 10^{12}$ ions/cm$^2$ at an energy of approximately 150 KeV.

A high voltage region mask need not be formed when the lightly doped substrate itself serves as the high voltage region. However, if it is desired to adjust the dopant type or the dopant concentration in the high voltage region, a high voltage region mask (not shown) is formed using photoresist in order to expose field and active regions 68 for high voltage devices. This step is followed by a high voltage region implant using a selected impurity type. For example, for a P type high voltage region, a dopant concentration of approximately $1 \times 10^{14}$ to $4 \times 10^{14}$ P type atoms/cm$^3$ is used. In one embodiment, the field implant for the high voltage region is performed together with either the N type or P type field implant described above, as appropriate, depending on the dopant type of the high voltage region.

FIG. 7e illustrates the semiconductor structure after the formation of the N well mask, N well implant, and removal of the N well mask, formation of the P well mask, P well implant, and removal of the P well mask, and formation of the high voltage region mask, high voltage region implant, and removal of the high voltage region mask.

Figure 7F:
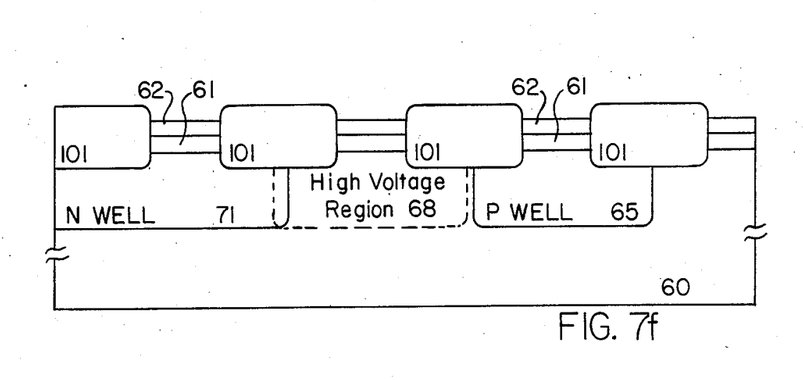

As shown in FIG. 7f, the dopants in the N well and P well and high voltage region implants are then diffused into substrate 60 by subjecting the wafer to an oxygen atmosphere at about 1150° C. for approximately 8 to 12 hours, which also forms a field oxide layer 101 with a thickness of about 1000 Å. The field oxide 101 is then further grown in a wet oxygen ambient at approximately 1000° C. for approximately 2 to 4 hours to a final thickness of about 6,000 to 10,000 Å. Field oxide 101 serves as electrical isolation between adjacent active areas formed within substrate 60. FIG. 7f shows the semiconductor structure after field oxidation with N well 71, high voltage region 68 and P well 65 formed in the substrate. The dotted line around the high voltage region 68 in FIG. 7f indicates that this region may be the substrate itself if no high voltage region implant is employed.

Figure 7G:
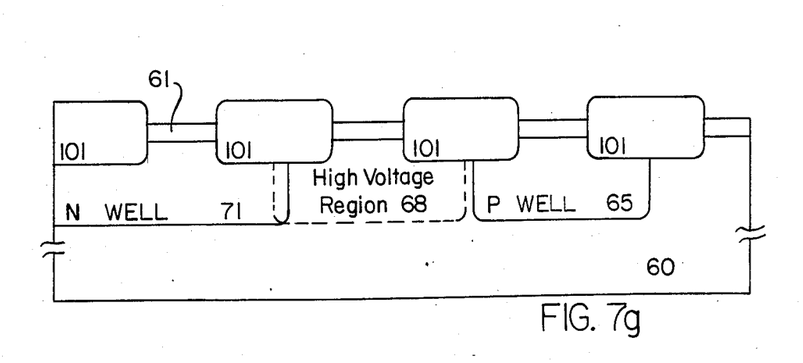
Figure 7H:
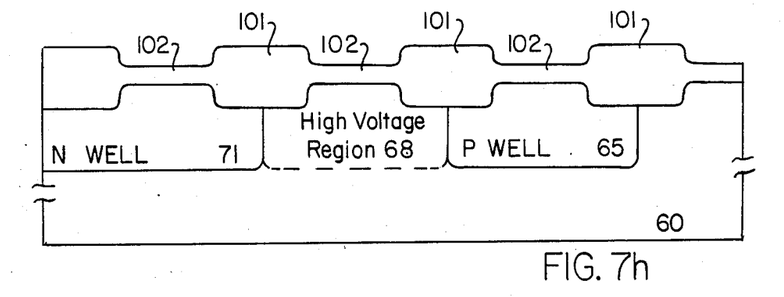
Figure 7I:
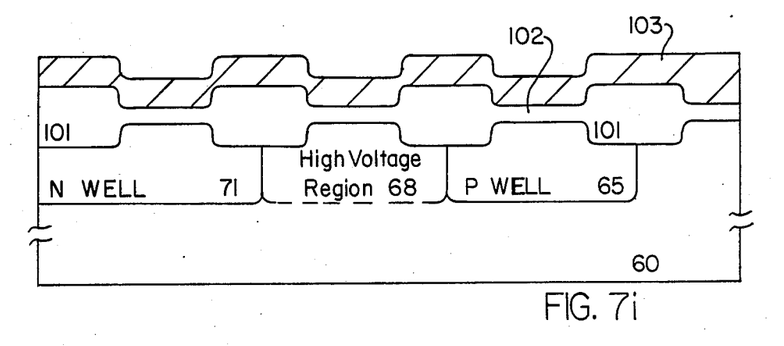

Nitride layer 62 is then removed, for example using a phosphoric acid wet etch or a CF$_4$ plasma etch, in order to form the semiconductor structure in FIG. 7g with nitride layer 62 removed from the active areas. The base' oxide 61 is then stripped from the active regions, for example by etching with buffered HF, and a layer of gate oxide 102 is formed over the entire semiconductor structure to a thickness within the range of approximately 300-350 Å as shown in FIG. 7h, for example by thermal oxidation in dry oxygen with approximately 3% HCl at approximately 900° C. for approximately 90 minutes. If desired, after formation of gate oxide layer 102, appropriate threshold adjustment implants are performed, as is well known in the art.

Polycrystalline silicon layer 103 (shown in FIG. 7i) is then deposited to a thickness of approximately 3500 Å over the entire semiconductor structure, for example by low pressure chemical vapor deposition. Polycrystalline silicon layer 103 serves as electrical interconnect, device gate areas, and capacitor electrodes. Polycrystalline silicon layer 103 is doped with phosphorous to decrease sheet resistance to approximately 20 to 30 ohms/square.

Figure 7J:
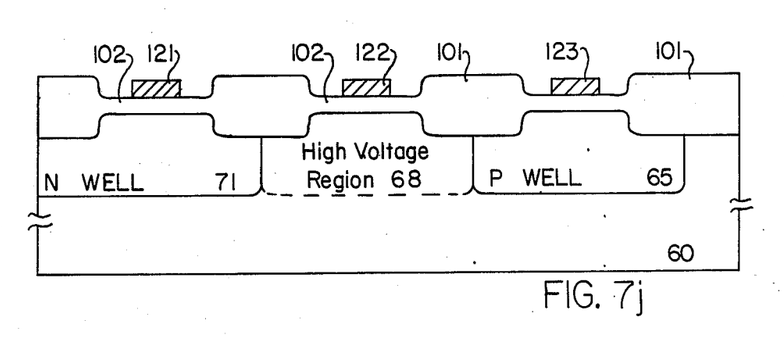

As shown in FIG. 7j, using photoresist and well-known photolithigraphic and etching techniques (for example etching with CF$_4$ plasma) gates 121, 122 and 123 for active devices in the N well 71, high voltage region 68, and P well 65 and doped polycrystalline silicon interconnects (not shown) are then formed.

Second Embodiment

Figure 8A:
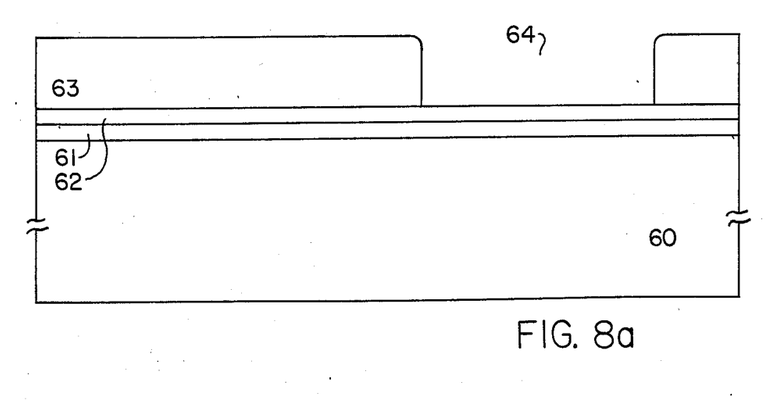
FIGS. 8a through 8h show steps in forming three wells of different composition using the method of this invention where adjacent wells are self-aligned.
Figure 8B:
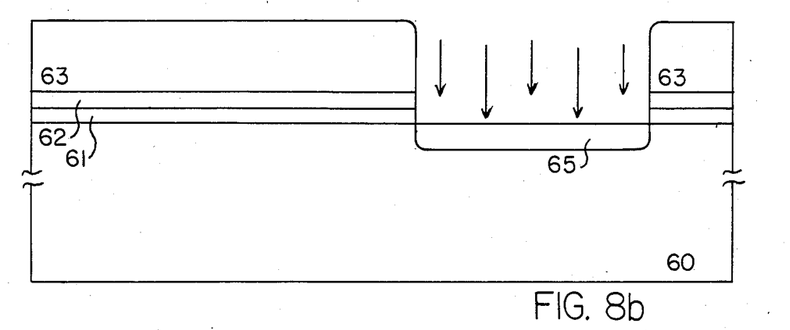

According to a second method for forming the separately implanted well regions of this invention in which adjacent well regions are automatically self-aligned, base oxide layer 61 and nitride layer 62 shown in FIG. 8a are then patterned to define one of the well regions of the device. Referring to FIG. 8a, this patterning is accomplished by spinning onto nitride layer 62 photoresist 63 which is then soft baked. The first well region mask is then aligned to the wafer and the portions of photoresist exposed by the mask are subjected to actinic radiation. Exposed portions 64 of the photoresist are then removed as shown in FIG. 8a. Photoresist 63 is then hard baked so that it is not affected by the etchants which will be used to remove the unmasked regions of nitride and oxide. Typically, plasma etching is then used to remove the unmasked regions of nitride, and buffered HF is used to remove the regions of oxide as shown in FIG. 8b.

A P well implant 65 is performed using boron at a dosage of approximately $6 \times 10^{12}$ ions/cm$^2$ at an energy level of approximately 120 KeV.

Figure 8C:
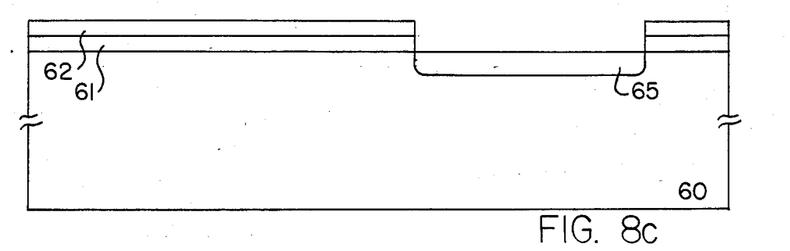

As shown in FIG. 8c, photoresist 63 is then removed.

Figure 8D:
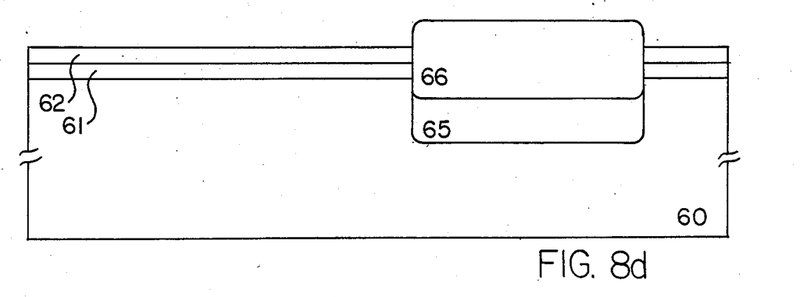

As shown in FIG. 8d, following the doping of P well 65, a layer of oxide 66 is formed on the exposed region and the dopants in P-well 65 are simultaneously slightly diffused into substrate 60 by subjecting the wafer to an oxygen atmosphere within the range of approximately 900° to 1000° C. for approximately 1–3 hours, which forms oxide layer 66 to a thickness of approximately 3,000 Å.

Figure 8E:
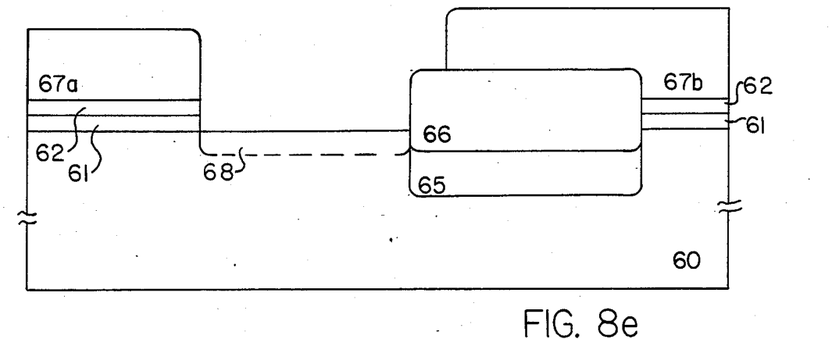

As shown in FIG. 8e, after formation of oxide 66, a second layer of photoresist 67a and 67b is applied and patterned to expose the area where the second well region will be formed. The exposed portions of nitride 62 and oxide 61 are removed (in a manner such as has been previously described), exposing the area which will become a second well 68.

The formation of this second well demonstrates a significant feature of this self-aligned method. On one side, oxide layer 66 rather than the second layer of photoresist 67b serves to define the edge of the second well. Therefore, the edge of the second well 68 is perfectly aligned with the edge of the first well 65 without depending on perfect alignment of photoresist 67b. Thus, problems with prior art alignment of adjacent wells are overcome and yet the process remains simple and inexpensive.

In this embodiment, the second well is doped for forming a high voltage device A high voltage region need not be formed when the lightly-doped substrate itself has the desired characteristics to serve as the high voltage region. However, if it is desired to adjust the dopant type or the dopant concentration in the high voltage region, exposed high voltage region 68 may be implanted using a selected impurity type as shown in FIG. 8e. Fcr example, for a P-type high voltage region, a final dopant concentration of approximately $1 \times 10^{14}$ to $4 \times 10^{14}$ atoms/cm$^3$ is used.

Figure 8F:
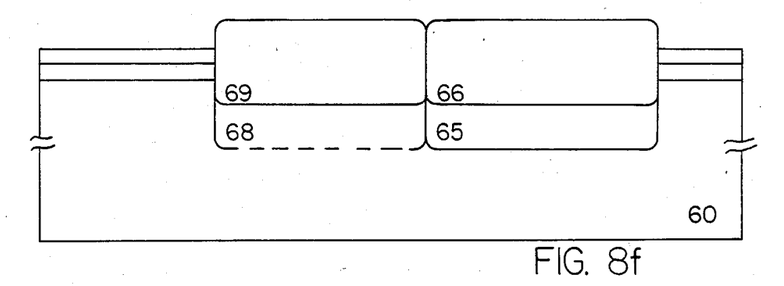

As shown in FIG. 8f, after implantation, as with the P well dopants, high voltage region dopants are slightly diffused and oxide 69 grown on the exposed area. The same conditions described above for growing oxide on the P well will result in fast growth of oxide on the exposed high voltage region and much slower thickening of the existing oxide above the P well. This is because oxide growth is highly nonlinear, depending on the proximity of silicon atoms and oxygen atoms to each other.

Figure 8G:
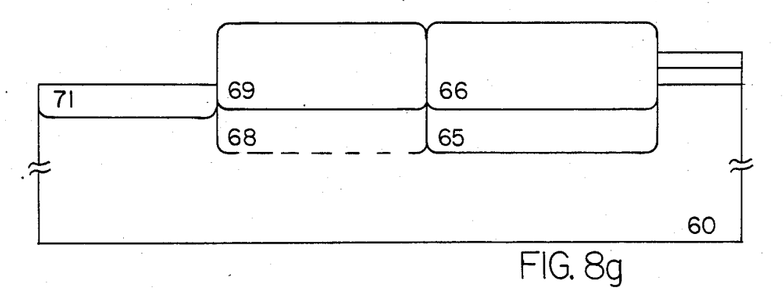

As shown in FIG. 8g, oxide and nitride are then removed from the area adjacent to high voltage well 68 where N well 71 is to be formed. An N-type dopant such as phosphorus is then used to provide a low energy implant at a dosage of approximately $5 \times 10^{12}$ ions/cm$^2$ at an energy level of approximately 25 KeV. The dopants in well regions 65, 68 and 71 are now diffused to their desired junction depth of approximately 3 to 6 microns, for example by heating the wafer in a dry oxygen atmostphere at approximately 1150° C. for approximately 8 to 12 hours, thus forming oxide 72 to a thickness of approximately 1000 Å.

Figure 8H:
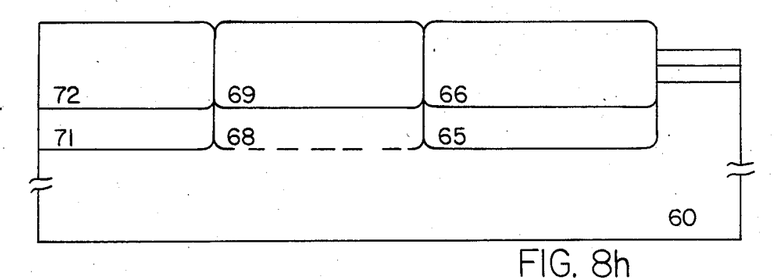

Alternatively, if desired, portions of oxide 61 and nitride 62 need not be removed from the area adjacent to high voltage well 68 where N well 71 is to be formed. In this event, an N type dopant such as phosphorous is used to provide an implant through oxide 61 and nitride 62 covering to be formed N well 71. At this time, thick oxide layers 66 and 69 serve as a mask. After implantation, the device is heated in order to diffuse the dopants to form N well 71 as shown in FIG. 8h. Since nitride layer 62 remains, thick oxide layer 72 shown in FIG. 8h is not formed above N well region 71. Using appropriate and well known techniques, nitride layer 62 and oxide layers 61, 69 and 66 are then removed, and further processing as described below provides the structure shown in FIG. 9.

Note that three types of wells have thus been formed using only two photoresist masks 63 and 67a,b, and that it was not necessary to align the edge of one photoresist mask with the edge of a previous mask. Thus, a simpler manufacturing process with automatic self-alignment has been achieved.

Optionally, oxide 72 may be grown to diffuse well 71 to the depth of wells 68 and 65. Oxide layers 66, 69 and 72 are then removed, leaving a tri-well substrate for device formation having good planarity and sharply defined well regions.

FIG. 8h shows the semiconductor structure after oxidation, leaving N well 71, high voltage region 68 and P well 65 formed in the substrate. The dotted line around the high voltage region 68 in FIG. 8h indicates that this region may be the substrate itself if no high voltage region implant is employed. Oxide layers 66, 69 and 72 are then removed using, for example, buffered HF, and devices are formed in well regions 65, 68 and 71 in a well-known manner.

Figure 8I:
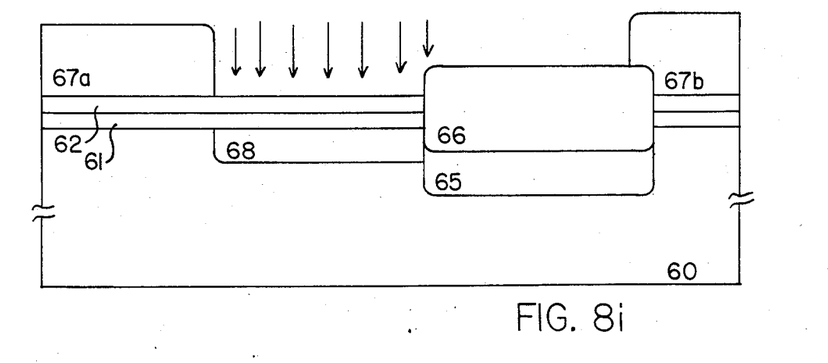
FIGS. 8i and 8j show a device having two implanted, self-aligned wells and a third self-aligned high voltage region available for active device formation.
Figure 8J:
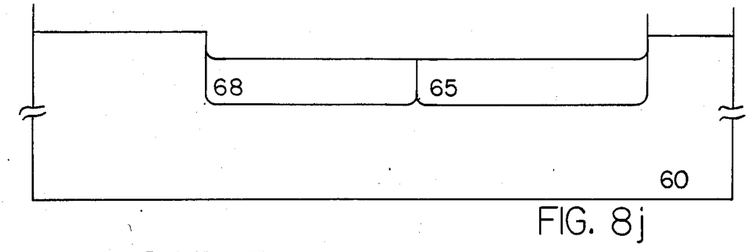

An alternative embodiment shown in FIG. 8j provides a structure having two implanted and diffused wells 65, 68, and which uses substrate 60 as the high voltage region without requiring an implant in the high voltage region. In this alternative embodiment, after forming oxide layer 66 as shown in FIG. 8d, and applying photoresist 67a, 67b, as shown in FIG. 8e, implantation is then performed through oxide/nitride layers 61 and 62 to form implanted well region 68 as shown in FIG. 8i. Well 68 is automatically selfaligned with well 65. Subsequent heating to a temperature of approximately 1,150° C. for approximately 8 to 12 hours diffuses implanted well 68. The layers of nitride 62, thick oxide 66 and thin oxide 61 are then removed to produce the substrate of FIG. 8j having three regions for forming active devices: implanted well 65, implanted well 68, and substrate region 60 which is appropriate for high voltage devices.

As will also be appreciated by those who are skilled in the art in light of the teachings of this invention, it is also possible to implant well region 68 by first removing nitride layer 62. In this event, during the diffusion of implanted dopants in well region 68, an additional thick oxide layer is formed over N well 68. This thick oxide is then simultaneously removed with the removal of thick oxide layer 66.

Device Formed Using This Invention

Regardless of which embodiment is used, oxides formed over well regions and the substrate itself are removed, as is any remaining nitride. A new base oxide layer (200 to 500 Å thick) and a layer of nitride (1500 Å) is formed thereon. An active area mask, which defines the active regions, is used followed by field implantation and the formation of field oxide (typically 10,000 Å thick), as is known in the art. The initial base oxide/nitride layer is removed, and a gate dielectric is formed.

Figure 9:
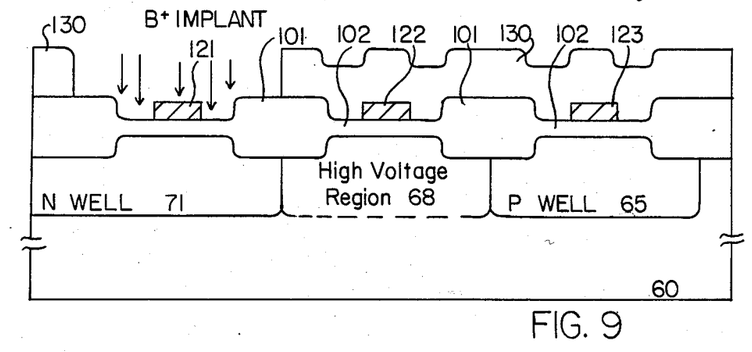
FIGS. 9 through 11 show steps of well known design used to form a device upon the substrate which was formed as shown in FIGS. 7a through 7j or FIGS. 8a through 8h according to the method of this invention.
Figure 10:
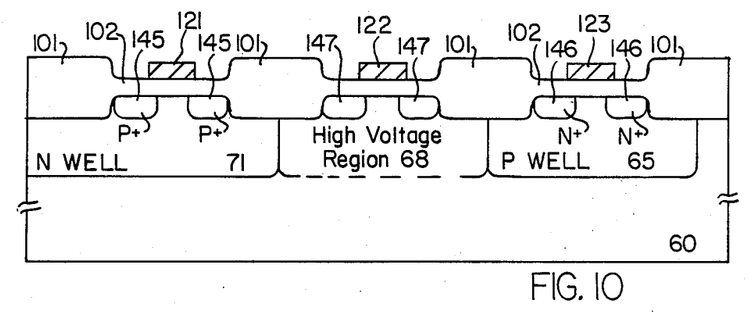
Figure 11:
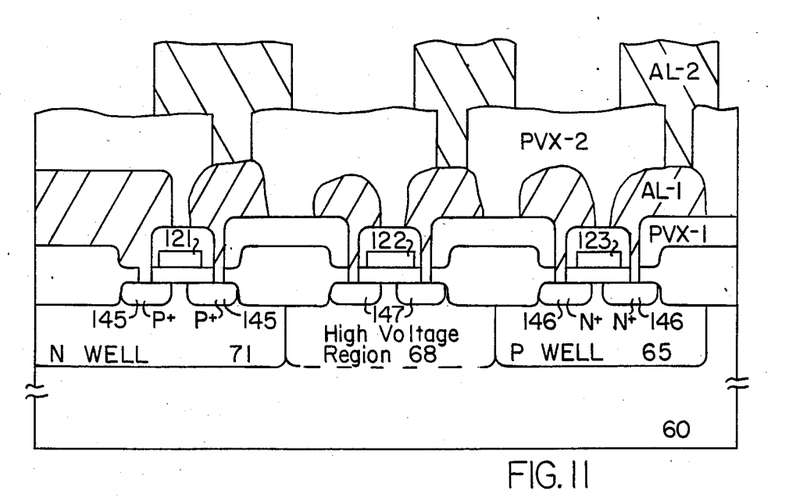

FIGS. 9–11 show formation of a portion of a typical circuit using the tri-well substrate just described after formation by any of the method embodiments which have been described in detail. Thick oxide 101 is formed at the boundaries between one well and the next to prevent formation of parasitic current paths between one active device and the next. A thinner portion of oxide 102 for insulation purpose is formed over the centers of each well region.

A polycrystalline silicon layer is then deposited as described earlier and gates 121, 122 and 123 for active devices in N well 71, high voltage region 68, and P well 65 and doped polycrystalline silicon interconnects (not shown) are then formed.

Source and drain regions 145 (shown in FIG. 10) are formed in N well 71 by forming a P type source/drain mask 130 (shown in FIG. 9) of photoresist which, exposes the regions where P type boron ions are to be implanted to form source/drain regions. The boron implant is performed using a dosage of $3 \times 10^{15}$ ions/cm$^2$ at an energy level of approximately 50 KeV. If the high voltage region 68 is also N-type, boron mask 130 also exposes the high voltage region.

Similarly, N+ source and drain regions are formed in P well 65 by forming an N+ source/drain mask of photoresist (not shown) which exposes the regions where N+ type ions are to be implanted. The N+ implant can be performed using a dosage of approximately $5 \times 10^{15}$ phosphorous ions/cm$^2$ at an energy level of approximately 75 KeV. If the high voltage region 68 is also P type, the N+ source/drain implant for the high voltage region 68 is accomplished at the same time that the N+ source/drain regions are formed in P well 65.

After the source and drain implants, the wafer is subjected to an $O_2$ ambient at approximately 900° C. to 1000° C. to achieve appropriate junction depth of approximately 0.3 microns. During this process approximately 500 Å of oxide is grown on the source/drain regions. The resulting semiconductor structure shown in FIG. 9, has P+ N well source and drain regions 145, N+ P well source and drain regions 146 and source and drain regions 147 of a selected conductivity type in high voltage region 68.

Standard processing techniques are employed to complete the formation of active devices on regions 65, 68, and 71 to produce a device such as shown in FIG. 10, with first metal contact layer AL-1, second metal layer AL-2, first PVX layer PVX-1 and second PVX layer PVX-2.

The above embodiments are intended to be exemplary and not limiting, and in view of the above disclosure, many substitutions and modifications will be obvious to one of average skill in the art without departing from the spirit and scope of the invention. As but one example, as will be readily recognized by one of ordinary skill in the art in light of the teachings of this invention, the well regions can be formed first, and the field implants formed thereafter. As another example, it would of course be possible to form more than three regions, providing, for one example, two high voltage regions of opposite conductivity type. As yet another example, the second well can be formed not adjacent to the first well, photoresist serving to mark both boundaries of the second well. After forming of thick oxide on this second well, thick oxide over the first and second wells then defines both boundaries of a third well.

We claim:

1. A method of forming wells in a semiconductor substrate comprising:
    depositing a thin layer of oxide on said substrate,
    depositing a layer of silicon nitride on said thin layer of oxide,
    initiating a process to be repeated at least two times in the stated order of:
    applying a layer of photoresist,
    removing portions of said photoresist, thereby exposing portions of said silicon nitride,
    removing exposed portions of said silicon nitride and thin oxide, thus creating exposed portions of said semiconductor substrate,
    implanting dopants of a selected conductivity type to a selected concentration into said exposed portions of said semiconductor substrate, thereby forming a well of said selected conductivity type having a breakdown voltage determined by said selected concentration,
    oxidizing said exposed portions of semiconductor substrate thus creating protective thick oxide over said exposed portions and diffusing said dopants into said semiconductor substrate,
    and after sufficient repetition of said process, when the desired number of regions have been formed, removing said protective thick oxide.

2. A method for forming wells in a semiconductor substrate as in claim 1, where said process to be repeated at least two times is repeated three times.

3. A method for forming wells in a semiconductor substrate as in claim 1 wherein said first conductivity type is N and said second conductivity type is P.

4. A method for forming wells in a semiconductor substrate as in claim 1 wherein said first conductivity type is P and said second conductivity type is N.

5. A method for forming wells in a semiconductor substrate as in claim 1 where in subsequent repetitions of said process, said step of removing portions of said photoresist may also expose portions of said protective thick oxide, thus providing automatic alignment of adjacent wells.

6. A method for forming wells in a semiconductor substrate as in claim 3 wherein said dopants of said first conductivity type are phosphorous and said dopants of said second conductivity type are boron.

7. A method for forming wells in a semiconductor substrate as in claim 4 wherein said dopants of said first conductivity type are boron and said dopants of said second conductivity type are phosphorous.

8. A method of forming wells in a semiconductor substrate comprising:
    depositing a thin layer of oxide on said substrate,
    depositing a layer of silicon nitride on said thin layer of oxide,
    initiating a process to be repeated at least one time of:
    applying a layer of photoresist,
    removing portions of said photoresist, thereby exposing portions of said silicon nitride,
    removing exposed portions of said silicon nitride and thin oxide, thus creating exposed portions of said semiconductor substrate,
    implanting dopants of a selected conductivity type to a selected concentration into said exposed portions of said semiconductor substrate, thereby forming a well of said selected conductivity type having a breakdown voltage determined by said selected concentration,
    oxidizing said exposed portions of semiconductor substrate, thus creating protective thick oxide over said exposed portions and diffusing said dopants into said semiconductor substrate,
    and after sufficient repetition of said process, when one well region remains to be formed,
    applying a layer of photoresist,
    removing portions of said photoresist, thereby creating exposed portions of said silicon nitride,
    implanting through said exposed portions of silicon nitride and said thin layer of oxide dopants of a selected conductivity type to a selected concentration into said semiconductor substrate, thereby forming a well of said selected conductivity type having a breakdown voltage determined by said selected concentration,
    diffusing said dopants of a selected conductivity type into said semiconductor substrate,
    removing said layer of silicon nitride and said thin and thick layers of oxide.

9. A method for forming wells in a semiconductor substrate as in claim 8, where said process to be repeated at least one time is repeated one time.

10. A method for forming wells in a semiconductor substrate as in claim 8, where said process to be repeated at least one time is repeated two times.

11. A method for forming wells in a semiconductor substrate as in claim 8, where said first conductivity type is N and said second conductivity type is P.

12. A method for forming wells in a semiconductor substrate as in claim 8, wherein said first conductivity type is P and second conductivity type is N.

13. A method for forming wells in a semiconductor substrate as in claim 8, where said steps of removing portions of said photoresist thereby exposing portions of said silicon nitride may also expose portions of said protective thick oxide, thus providing automatic alignment of adjacent wells.

14. A method for forming wells in a semiconductor substrate as in claim 11, wherein said dopants of said first conductivity type are phosphorous and said dopants of said second conductivity type are boron.

15. A method for forming wells in a semiconductor substrate as in claim 12, wherein said dopants of said first conductivity type are boron and said dopants of said second conductivity type are phosphorous.

* * * * *

UNITED STATES PATENT AND TRADEMARK OFFICE
CERTIFICATE OF CORRECTION

PATENT NO. : 4,697,332
DATED : October 6, 1987
INVENTOR(S) : Richard C. Joy and Tarsaim L. Batra It is certified that error appears in the above-identified patent and that said Letters Patent are hereby corrected as shown below:

On the Title Page:

Page 1, [73], please change Assignee to read:

American Microsystems, Inc., Santa Clara, California

Signed and Sealed this

Fifth Day of April, 1988

*Attest:*

DONALD J. QUIGG

*Attesting Officer*

*Commissioner of Patents and Trademarks*